United States Patent [19]
Sang et al.

[11] Patent Number: 5,303,196
[45] Date of Patent: Apr. 12, 1994

[54] OPEN BIT LINE MEMORY DEVICES AND OPERATIONAL METHOD

[75] Inventors: Hoo D. Sang, Mahopac, N.Y.; Edmund J. Sprogis, Underhill, Vt.

[73] Assignee: International Business Machines Corporation, Armonk, N.Y.

[21] Appl. No.: 888,226

[22] Filed: May 22, 1992

[51] Int. Cl.$^5$ .............................................. G11C 13/00
[52] U.S. Cl. ................................ 365/206; 365/207; 365/196; 365/189.01
[58] Field of Search ................ 365/206, 51, 230.01, 365/189.01, 207, 196

[56] References Cited

U.S. PATENT DOCUMENTS

| | | | |
|---|---|---|---|
| 4,312,047 | 1/1982 | Donoghue | 365/189 |
| 4,375,600 | 3/1983 | Wu | 307/530 |
| 4,586,171 | 4/1986 | Fujishima | 365/205 |
| 4,694,428 | 9/1981 | Matsumura et al. | 365/189 |
| 4,701,885 | 10/1987 | McElroy | 365/189 |
| 4,733,374 | 3/1988 | Furuyama et al. | 365/205 |
| 4,804,871 | 2/1989 | Walters, Jr. | 365/190 |
| 4,888,732 | 12/1989 | Inoue et al. | 365/51 |
| 4,903,344 | 2/1990 | Inoue | 365/51 |
| 4,918,663 | 4/1990 | Remington et al. | 365/226 |

FOREIGN PATENT DOCUMENTS

63-206991 8/1988 Japan.

*Primary Examiner*—Eugene R. LaRoche
*Assistant Examiner*—Huan Hoang
*Attorney, Agent, or Firm*—Heslin & Rothenberg

[57] ABSTRACT

An open bit line memory device and operational method are provided having performance characteristics commensurate with those of folded bit line architecture. The memory device includes a plurality of memory cells in open bit line configuration, at least some of which are interconnected by a bit line. A sense amplifier unit is coupled to the bit line for sensing a developing signal thereon during a predefined bit line signal development interval. The amplifier sets to one of two logical states during a subsequent setting interval. An electrical isolator is employed to decouple the bit line from the sense amplifier during the setting interval so that signal variations on the bit line do not effect the amplifier. Each bit line also has an associated reference voltage line, and the electrical isolator isolates both the bit line and the associated reference voltage line from the sense amplifier during amplifier's setting period.

25 Claims, 4 Drawing Sheets fig. 2 fig. 3 fig. 4

OPEN BIT LINE MEMORY DEVICES AND OPERATIONAL METHOD

BACKGROUND OF INVENTION

1. Technical Field

This invention relates in general to semiconductor memory devices and to their operation, and more particularly, to dynamic random access memory (DRAM) devices configured with a novel open bit line architecture and to an operational method thereof.

2. Background Art

Architecture of semiconductor memories is roughly divided into two types, namely, open bit line architecture and folded bit line architecture. Both architecture types are well known in the art and detailed information on each type, along with numerous variations thereon, is readily available in the open literature. (The present invention comprises a novel variation on a conventional open bit line architecture.)

In comparison with folded bit line architecture, open bit line architecture is more suitable for very close packing of memory cell arrays. Notwithstanding this, product chips using conventional open bit line cell arrays are rarely implemented, primarily because common mode noise reduction inherent in folded bit line architecture is lacking in open bit line architecture, at least without significant additional process complexity, signal loss and/or performance degradation. In view of the continuing advancement in the art towards greater and greater circuit integration, the open bit line configuration is drawing significant attention throughout the memory industry, especially in relation to 16 Mbit, 64 Mbit, and beyond, memories. This is because an open bit line architecture provides a memory cell at every X,Y cross-point location of the array, which is not possible with folded bit line architecture.

Folded bit line architecture (commonly used in DRAMs of, for example, 256 Kbits or 1 Mbits) is inherently limited by the degree of integration obtainable within a defined area. Since a folded memory array cannot accommodate disposition of a memory cell at each bit line, word line intersection (i.e., cross-point), the configuration is by necessity less dense than an open bit line memory structure. By way of example, folded bit line architecture typically requires twenty-five percent, or more, area than open bit line architecture to implement the same size memory array. Thus, in terms of density of structure, an open bit line configuration clearly has the advantage. However, common mode noise difficulties inherent in conventional open bit line architectures have limited its commercial manufacture.

In addition to inherent common mode noise imbalance, another difficulty experienced with conventional open bit line architectures is the problem of dealing with the reference bit line. The reference bit line, which in a folded architecture supplies common-mode noise rejection, is for open bit line architecture either a parasitic capacitance liability or a source of additional noise.

Thus, a genuine need exists in the semiconductor memory art for a more stable, less complex memory device which has the performance characteristics of a conventional folded bit line memory device, but yet has the cell density of open bit line architecture.

DISCLOSURE OF INVENTION

Briefly summarized, the present invention comprises in one aspect a novel open bit line memory device wherein at least some of the memory cells are interconnected by a bit line such that the bit line is able to perform selection of the interconnected memory cells. A signal detection unit is coupled to the bit line for sensing a developing signal on the line during a predefined bit line signal development interval. The detection unit also includes setting means for producing a signal having one of two logic states. The setting means operates during a predefined setting interval, which is subsequent the bit line signal development interval. Pursuant to the invention, this open bit line device includes an isolator for electrically separating the bit line from the signal detection unit for at least a portion of the unit's setting interval so that noise variations on the bit line during the setting interval do not effect the signal detection unit.

In a more specific embodiment, the invention comprises a dynamic random access memory device which includes a plurality of memory cells arranged in a novel open bit line architecture. At least some of the memory cells are interconnected by a bit line, which functions to select the interconnected memory cells. Selection means for identifying a particular one of the interconnected memory cells to be read is also provided. A reference voltage line is associated with the bit line for providing a predefined reference voltage signal. A sense amplifier is coupled to the bit line for sensing a developing signal on the line from the selected one of the plurality of interconnected memory cells during a predefined bit line signal development period. Also coupled to the amplifier is the reference voltage line associated with the subject bit line. The amplifier includes a setting means for producing one of two logic states based upon a determined differential between a sensed signal on the bit line and the reference voltage signal. The sense amplifier produces its set signal during a predefined setting interval. Lastly, an isolator is coupled to both the bit line and the associated reference voltage line for electrically isolating the lines from the sense amplifier for at least a portion of the sense amplifier's setting period so that signal variations on the lines are isolated from the sense amplifier for that portion of its setting interval.

In another aspect, the present invention comprises a memory cell reading method for an open bit line memory device having a plurality of memory cells arranged in rows and columns. The open bit line device includes a plurality of periodically spaced bit lines for performing column selection of memory cells and a plurality of periodically spaced word lines for performing row selection of memory cells. The method includes the steps of: allowing a signal to develop on one of the plurality of bit lines representative of the state of a selected one of the memory cells interconnected by the subject bit line; utilizing a sensing device to read the signal on the selected bit line during a predefined bit line signal development period; electrically isolating the selected bit line from the sensing device; and at least partially simultaneous with the isolating step, producing a signal having one of two logical states based upon the signal developed on the selected bit line. The at least partial isolation step allows the signal produced by the sensing device to be defined at least partially independent of any continuing signal variations on the selected bit line.

To summarize, a novel open bit line DRAM device, which is dense, requires no additional wiring levels, and is also easily laid out, is provided herein. The sense amplifier connection layout is similar to that of a folded sense amplifier layout. However, no reference bit line cells are required and no noise generated on a selected bit line (and associated reference voltage line) is passed to the sense amplifier while the sense amplifier is setting. In addition, the architecture presented allows for easy access of all array bits in a block-type layout with no special layout requirements on array edges. Improved sense amplifier setting performance is obtained through the light loading of internal sense amplifier nodes during the setting interval. Therefore, the sense amplifier can set rail to rail very quickly. Thus, bit switch timing can also be increased with faster driving of the data lines and I/O path.

BRIEF DESCRIPTION OF DRAWINGS

These and other objects, advantages and features of the present invention will be more readily understood from the following detailed description of certain preferred embodiments thereof, when considered in conjunction with the accompanying drawings in which.

BEST MODE FOR CARRYING OUT THE INVENTION

Reference is now made to the drawings in which use of the same reference numbers/characters throughout different figures designate the same or similar components.

Figure 1:
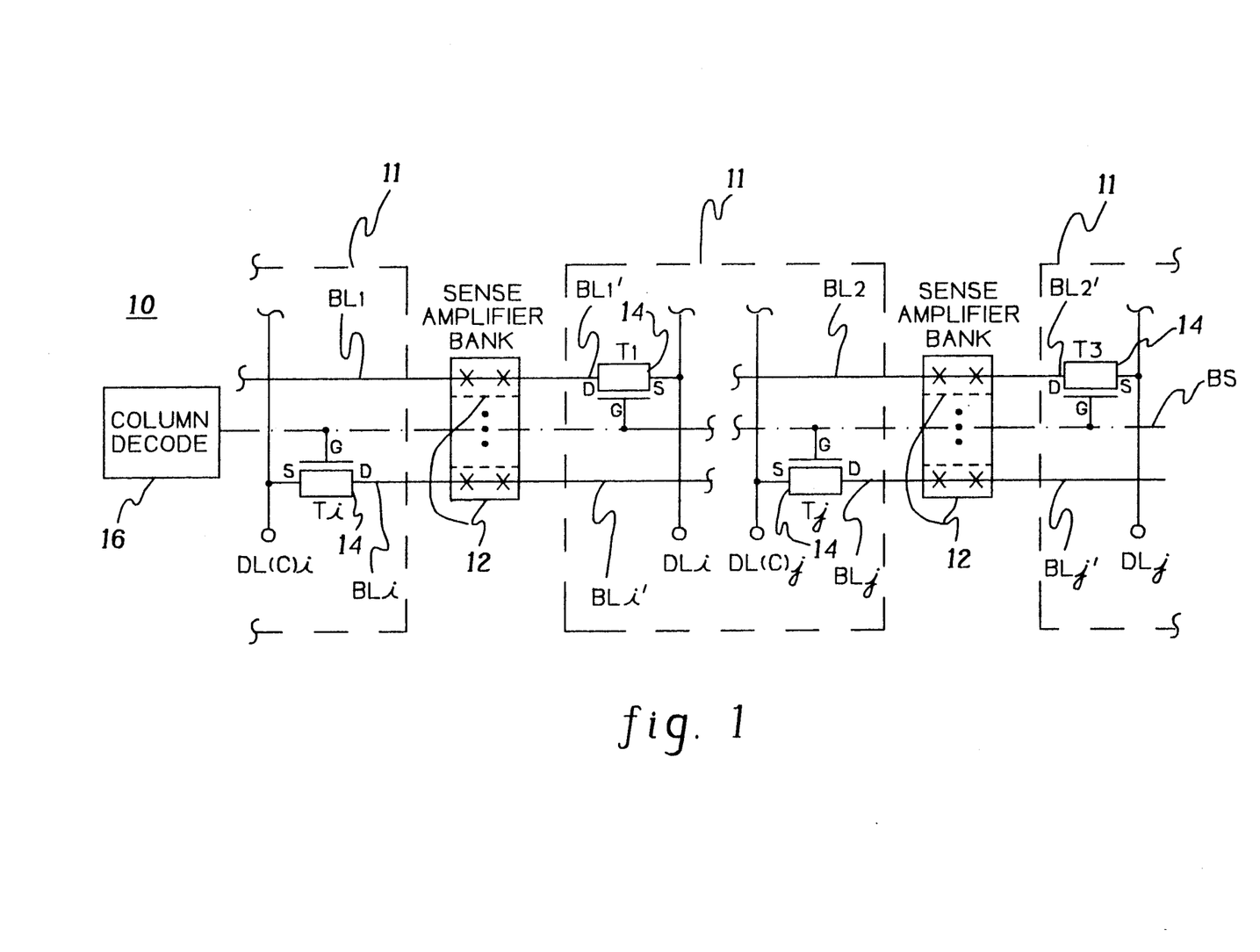
FIG. 1 is a partial schematic of a conventional open bit line DRAM architecture.

A conventional interleaved open bit line architecture, generally denoted 10, is depicted in FIG. 1. Arrangement 10, which is assumed to comprise a DRAM structure, includes multiple arrays 11 of memory cells (not shown). To reduce signal noise, each array 11 is typically disposed within a unique array well in a supporting substrate (not shown). Open bit line arrangement 10 also includes multiple sense amplifier banks, each of which contains multiple sense amplifier units 12. Each unit 12 is coupled to receive signals from a paired set of bit lines (such as BL1, BL1'; BL2, BL2'; BLi, BLi'; & BLj, BLj') on opposite sides of the respective sense amplifier bank. Thus, the true and complement (or reference) bit line pairings for this conventional open bit line configuration are on opposite sides of the corresponding sense amplifier unit 12.

The bit switch "BS" gate line (shown in phantom) runs parallel to the various bit lines but on a second wiring level. Line "BS" connects selected bit lines to the appropriate data line bus, i.e., data line "DLi", "DLj" or complementary data line "DL(C)i", "DL(C)j". Selection occurs through data output control transistors 14 (e.g., T1, T3, Ti, Tj), each of which is responsive to a unique control signal generated by a column decode circuit 16, and each of which is coupled between a data line bus and an adjacent sense amplifier bank. (In the examples depicted, the transistors comprise n channel field effect transistors (NFETs) which are represented by a rectangle having a control element or gate electrode arranged adjacent thereto. Alternatively, the circuits provided herein could be implemented with p channel field effect transistors (PFETs).)

In the conventional open bit line architecture of FIG. 1, memory cells (not shown) are assumed to be disposed at every bit line, word line intersection (i.e., at every X,Y cross-point) in each array 11. Further, it is assumed that there are multiple bit line pairings coupled to each sense amplifier bank.

As noted, conventional open bit line architecture, such as arrangement 10, has a number of inherent problems. For example, the arrangement requires a second wiring level to accommodate a bit switch gate line "BS" which, besides increasing manufacturing complexity, results in additional bit line parasitic capacitance. Further, along with reference cell layout difficulties, it is difficult to utilize edge array cells in a conventional open bit line architecture. Also, array well voltage bounce under a selected bit line and/or reference bit line array can comprise a significant source of unbalanced noise between paired inputs to a sense amplifier unit. Lastly, a common problem addressed by many open bit line architectures is how to deal with the reference bit line, which is typically either a parasitic capacitance liability or a source of additional noise.

A significant feature to the architecture disclosed herein is the elimination of the reference bit line as heretofore known in the art. This reference line elimination is accomplished without compromising sense amplifier balance. In general, the architecture disclosed herein utilizes a reference voltage signal in association with each bit line of a modified open bit line array. Bit lines are configured in an open cell architecture (i.e., a memory cell is disposed at each X,Y cross-point in the array) while common mode noise is able to be inherently reduced in a manner similar to that of folded bit line architecture. Common mode noise reduction is possible pursuant to the present invention because each bit line and its associated reference bit line are no longer in different array wells on opposite sides of the corresponding sense amplifier unit. Rather, each bit line is associated with a drastically truncated reference voltage line, and both are disposed on the same side of a sense amplifier unit. In this regard, the architecture is more analogous to a folded bit line configuration.

Use of a reference voltage line directly coupled to a reference voltage generator without overwhelming the associated sense amplifier unit is made possible through the provision of periodically activated signal isolators connected between the reference voltage line and the sense amplifier and between the associated bit line and the sense amplifier. In this way, the sense amplifier can be decoupled from signals on either of the associated lines as the amplifier is setting to one of two logic states. Selective isolation in the modified architecture of the present invention simultaneously prevents the amplifier from being overwhelmed by the reference voltage generator and provides signal isolation against ongoing noise on the bit line and/or reference voltage line. As enumerated below, the novel circuitry presented herein possesses significant performance advantages over any heretofore known open bit line or folded bit line architecture.

Figure 2:
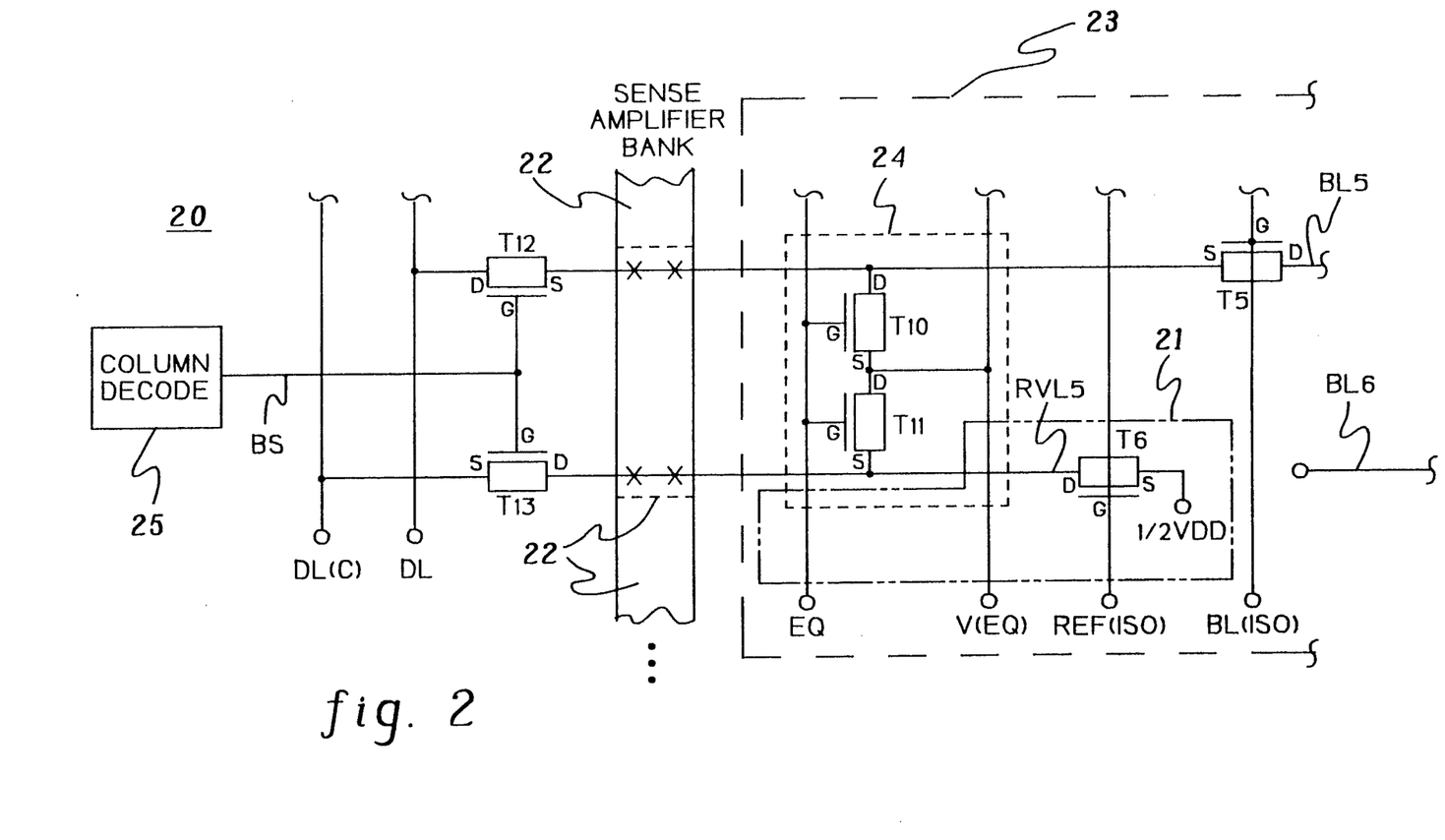
FIG. 2 is a partial schematic of an open bit line memory architecture pursuant to the present invention.

FIG. 2 depicts one embodiment of a memory device, generally denoted 20, pursuant to the present invention. Broadly described, device 20 comprises a switched-gate isolation device which allows a folded sense amplifier layout to operate within a novel open bit line architecture. (Again, "open bit line architecture" is used herein to refer to a memory device having memory cells disposed at substantially every X,Y cross-point location in the memory array.) As shown, what would normally be a full reference bit line (e.g., in a folded bit line array configuration) is truncated to a small reference voltage signal supply circuit 21, which is used for capacitance coupling balance when the isolation device (discussed below) is switched off. The reference voltage line of the present invention is thus a vestigial portion of a conventional reference bit line cell.

In arrangement 20, the memory cells (again, not shown) to be selected for reading by one or more sense amplifier units 22 in the depicted sense amplifier bank are disposed in a single array 23 to the right of the amplifier bank. One or more mirror image sense amplifier bank(s), memory array(s) and connecting structures could further exist to the right of the structures shown. In this way, every other bit line in array 23 is coupled to a different one of two sense amplifier banks disposed on opposite sides of the respective memory array, with each bit line (e.g. BL5 & BL6) terminating before reaching the other of the two opposing sens amplifier banks. Between the termination of the bit line and the sense amplifier bank to which the bit line is not coupled, reference voltage circuit 21 is positioned. Circuit 21 includes a reference voltage line, e.g., RVL5, and a reference voltage generator (not shown). The reference voltage generator produces a preselected voltage, such as the depicted ½ VDD, in part for input to the sense amplifier unit 22 coupled thereto.

Between each bit line "BL" and associated sense amplifier unit 22, an isolation device is disposed, such as a switched-gate isolation transistor T5. Transistor T5 is gated "G" by an appropriately timed bit line isolation signal "BL(ISO)," and has its drain "D" connected to line BL5 and source "S" connected to unit 22. Similarly, a reference isolation device, such as a switched-gate reference transistor T6, is disposed to isolate a reference voltage generator (not shown) from sense amplifier unit 22 when active. Transistor T6 is gated "G" by an appropriately timed control signal "REF(ISO)" and has a source "S" coupled to the reference generator (which, e.g., supplies a ½ VDD signal), and a drain "D" connected to unit 22. When both NFET isolation transistors T5 & T6 are active, the bit line "BL" and the truncated reference line "RVL" are each connected directly to the sense amplifier unit. Again, isolation devices T5 & T6 are shown to comprise NMOS transistors, however, any alternate signal isolation means could be used.

A first embodiment of a charge equalization circuit, denoted 24, is also depicted in FIG. 2. Sense amplifier units 22 set based on a determined differential between the signal on the respective bit line (e.g., BL5) in comparison with the signal on the corresponding reference voltage line (e.g., RVL5). Each unit 22 thus "reads" the value of the selected memory cell by setting to a high signal level or a low signal level based on the determined differential between signals on the associated bit and reference lines.

Figure 3:
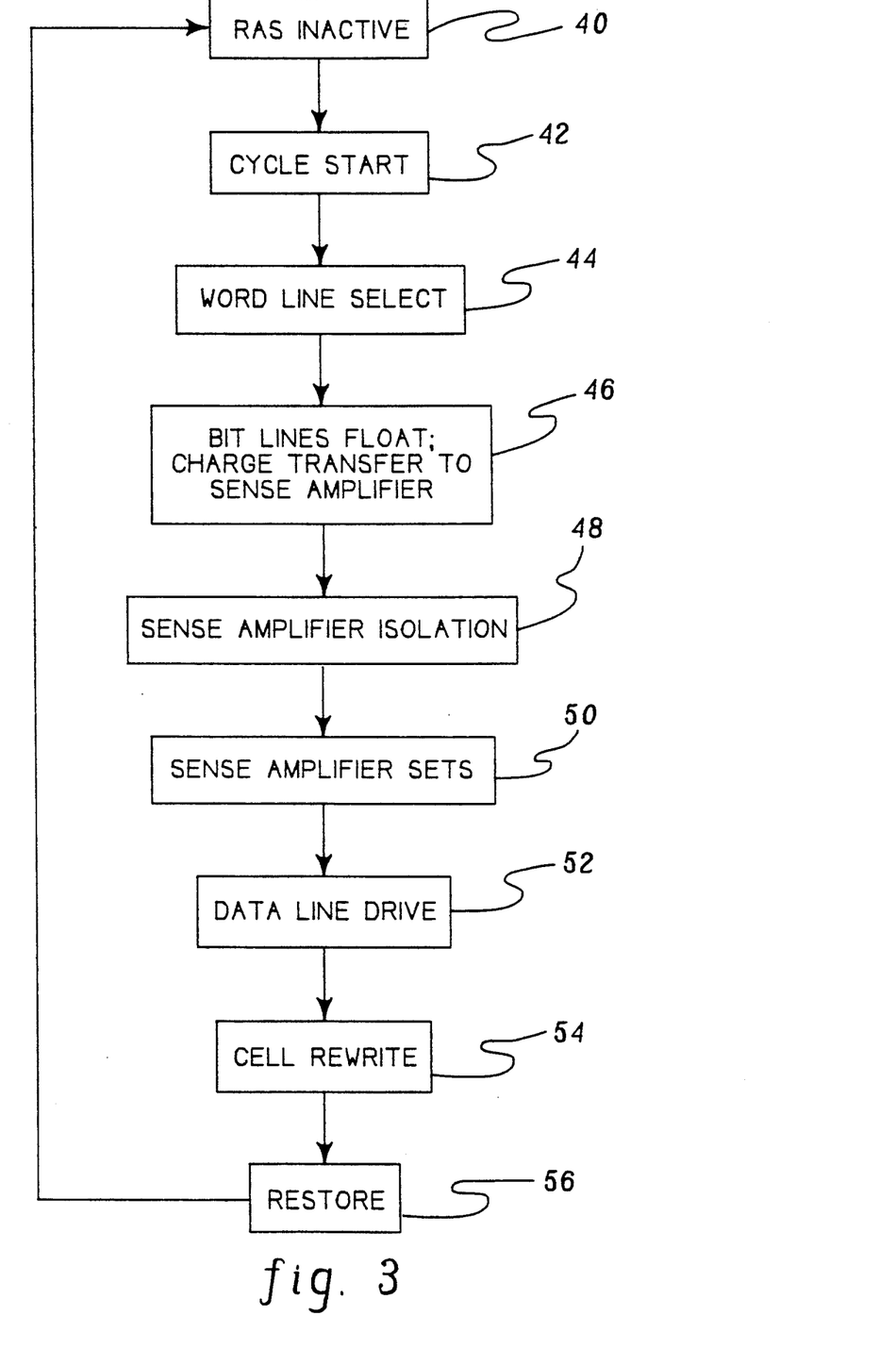
FIG. 3 is a flowchart of a memory array processing embodiment pursuant to the present invention.

As is well known in the art, signals input to each sense amplifier unit are typically equalized for a predetermined period of time. Subsequent equalization, the signal on the bit line is allowed to float to a higher or lower value. The change in the signal on the bit line is driven primarily by the state of the selected memory cell. This time interval during which the bit line floats is referred to as the "bit line signal development period or interval". Subsequent development of the signal on the bit line, the sense amplifier unit experiences a "setting interval" during which time the unit sets to either a high signal value or a low signal value based on the differential between the developed signal on the bit line and the reference voltage signal, which will remain relatively constant, i.e., assuming that the bit line and reference voltage line are equalized at the reference signal voltage. At some time subsequent setting of the sense amplifier unit, the bit line and its truncated reference voltage line are returned to an equalized state. (The operation of a memory device pursuant to the present invention is described further below with reference to (FIG. 3.).

FIG. 2 also depicts one possible embodiment of circuitry, labeled 24, to accomplish equalization between the lines. Equalization circuit 24 utilizes two serially connected transistors T10 & T11 disposed between the bit line BL5 and its associated reference voltage line RVL5. Each transistor T10 & T11 is gated "G" by an equalization control signal "EQ". The drain "D" of transistor T10 is connected to bit line BL5, while its source "S" is coupled to the drain "D" of transistor T11. The common node connection between transistors T10 & T11 is also connected to an equalization voltage supply line "V(EQ)", which by way of example may comprise a ½ VDD signal. The source "S" of transistor T11 is connected to reference voltage line RVL5. Thus, when the signal on control line "EQ" is high, transistors T10 & T11 are active and equalization voltage "V(EQ)" is applied directly to lines BL5 & RVL5. An alternate embodiment of an equalization circuit for use in connection with the present invention is presented further below with reference to FIG. 4.

Continuing with FIG. 2, data is read out from amplifier unit 22 to either a true data line bus "DL" or a complementary data line bus "DL(C)" through switching transistors T12 & T13, which are gated "G" by a signal from a column decode circuit 25. Transistor T12 is connected between unit 22 and data line bus "DL" such that its drain "D" is connected to the data line and its source "S" connects to the sense amplifier unit. Conversely, transistor T13 has its drain "D" connected to the sense amplifier unit and its source "S" wired to the complementary data bus line "DL(C)".

An operational example of open bit line architecture processing pursuant to the present invention is next described with reference to the partial operational loop of FIG. 3. (An assumption is made herein that the subject memory array comprises a plurality of n-channel-type memory devices.)

Upon completion of a previous processing cycle, the row address strobe (RAS) is inactive, 40 "RAS Inactive." During this time interval, signals "EQ", "BL(ISO)", and "REF(ISO)" are high, the bit switch signal "BS" from the column decode circuit and the appropriate array word line are low, and the equalization voltage "V(EQ)" is at a predefined level, e.g., one-half VDD. A cycle starts, 42 "Cycle Start" (e.g., RAS Falls), and a word line is selected, 44 "Word Line Select." A charge is then transferred into the internal node of the sense amplifier from the connected bit line while the bit line floats, 46 "Bit Lines Float; Charge Transferred to Sense Amplifier." Thereafter, the sense amplifier is isolated, e.g., by dropping "BL(ISO)" and "REF(ISO)" low, 48 "Sense Amplifier Isolation". Once isolated, the amplifier sets using the signals developed at its internal nodes, 50 "Sense Amplifier Sets." Because of this amplifier isolation, the values to the input of the sense amplifier are frozen and the sense amplifier is independent of any signal variations on the bit line and/or reference line.

Subsequent to the amplifier setting interval, data is read out from the sense amplifier, 52 "Data Line Drive," by setting the bit switch "BS" high. The bit line (memory cell) which has been read is then rewritten, 54 "Cell Rewrite," which requires in part removal of the low signal on the bit line isolator "BL(ISO)" gate. Thereafter, equalization between the bit line and the reference voltage line is restored, i.e., "EQ" & "V(EQ)" go high, 56 "Restore," and isolation of the reference line "REF(ISO)" from the sense amplifier is removed.

As noted above, FIG. 4 depicts an alternate embodiment of an open bit line architecture pursuant to the present invention. This memory device, generally denoted 60, includes a memory array 63 having a plurality of memory cells (not shown) arranged in rows and columns. A sense amplifier bank is disposed adjacent array 63 and includes a plurality of sense amplifier units 62. As with a prior embodiment, each paired input to a sense amplifier unit originates from the same array well on one side of the sense amplifier bank. Thus, common mode noise reduction is inherent. Amplifier banks (only one of which is depicted) are disposed on opposing sides of memory array 63 and each bit line (e.g., BL7) is connected to only one sense amplifier bank. Again, each bit line is associated with a reference voltage line (e.g., RVL7).

Figure 4:
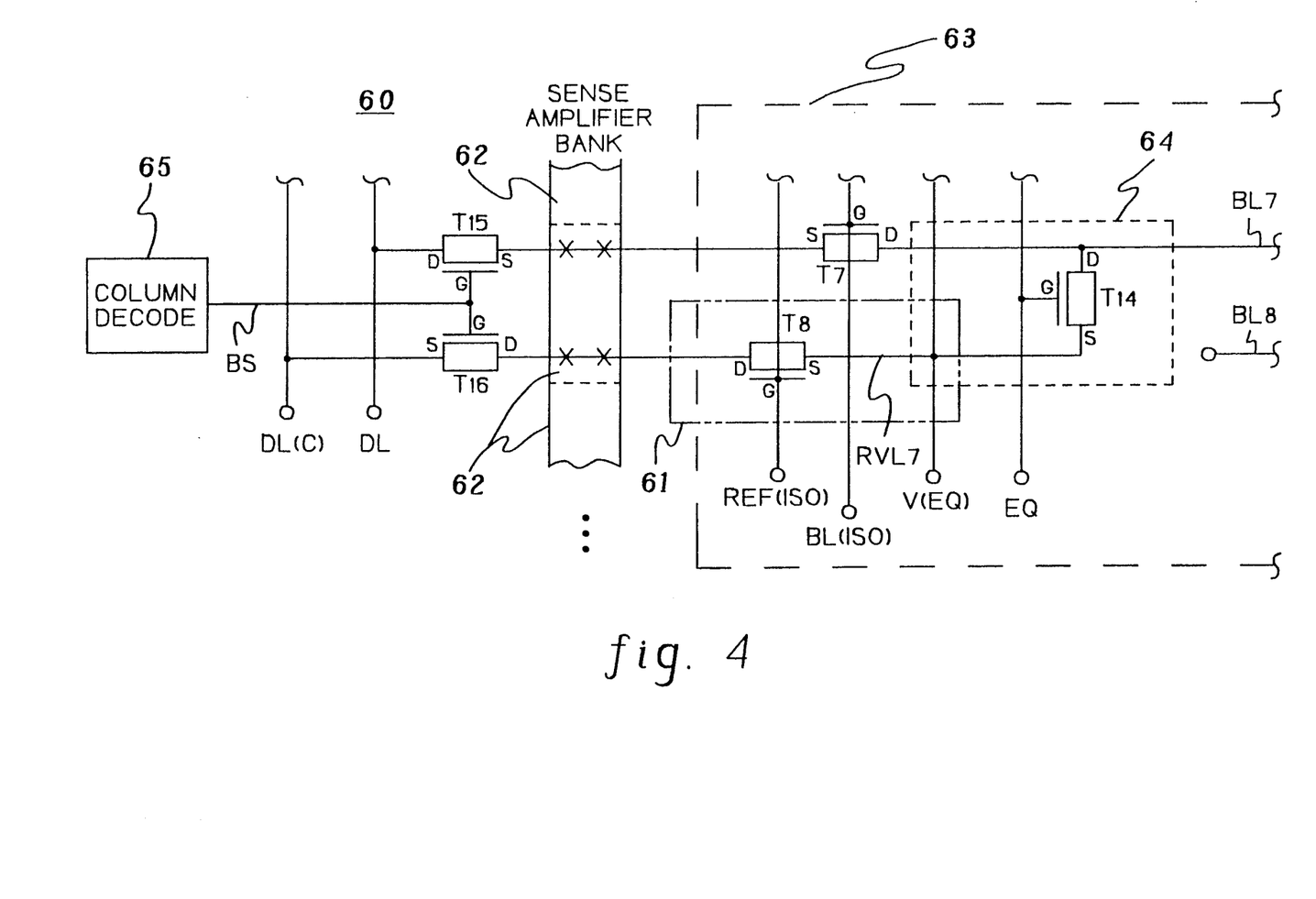
FIG. 4 is a partial schematic of an alternate embodiment of an open bit line memory architecture pursuant to the present invention.

Circuit 61 comprises the reference voltage supply to the depicted sense amplifier unit 62. Gated isolation transistors T7 & T8 again control connection of bit line BL7 and reference voltage line RVL7, respectively, to amplifier unit 62. Transistors T7 & T8 are gated and connected in the same manner as transistors T5 & T6 (FIG. 2) described above, except transistor T8 has its source "S" connected to receive the equalization voltage "V(EQ)" rather than a separate reference voltage supply. (In effect, the equalization voltage "V(EQ)" and reference voltage signal are made equal.)

Novel to this embodiment is the provision of a different equalization circuit, denoted 64, connected between the sample bit line BL7 and sample reference voltage line RVL7. Circuit 64 comprises a transistor T14, which in the embodiment depicted is an NFET gated "G" by the equalization "EQ" control signal. Transistor T14 has its drain "D" connected to bit line BL7 and its source "S" connected to the equalization voltage "V(EQ)". Although less complex than equalization circuit 24 of FIG. 2, it should be noted that this approach produces an equalization in the lines at a point removed from the two inputs to the sense amplifier bank. For this reason, the circuit of FIG. 2 is presently preferred. Data is read out from amplifier unit 62 in a manner similar to the process described above in connection with unit 22 of FIG. 2. In FIG. 4, the data output switching transistors are labeled T15 & T16, and are gated "G" by a bit switch "BS" signal from a column decode circuit 65.

It should be understood from the above discussion that a novel open bit line configured memory device and processing method have been provided. The device is dense, requires no additional wiring levels, and is easily laid out. The sense amplifier connection layout is similar to that of a folded sense amplifier layout. However, no reference bit line cells are required and no noise generated on a selected bit line and/or associated reference voltage line is passed to the sense amplifier while the sense amplifier is setting. In addition, the architecture presented allows for easy access of all array bits in a block-type layout with no special layout requirements on array edges. Improved sense amplifier setting performance is obtained through the light loading of internal sense amplifier nodes. Therefore, the sense amplifier can set rail to rail very quickly. Thus, bit switch timing can also be increased with faster driving of the data lines and I/O path.

Although specific embodiments of the present invention have been illustrated in the accompanying drawings and described in the foregoing detailed description, it will be understood that the invention is not limited to the particular embodiments described herein, but is capable of numerous rearrangements, modifications, and substitutions without departing from the scope of the invention. The following claims are intended to encompass all such modifications.

We claim:

1. An open bit line memory device comprising:
   a plurality of memory cells arranged in an open bit line configuration, at least some of said memory cells being interconnected by a bit line, said bit line performing selection of said interconnected memory cells;
   a signal detection unit coupled to said bit line for sensing a developing signal thereon during a predefined bit line signal development interval, said signal detection unit including means for setting to one of two logical states during a setting interval, said setting interval being subsequent to said predefined bit line signal development interval; and
   means for electrically isolating said bit line from said signal detection unit for at least a portion of said setting interval so that any signal variations on said bit line are isolated from said detection unit.

2. The open bit line memory device of claim 1, wherein said electrical isolating means isolates said signal detection unit from said bit line for the entire length of said setting interval.

3. The open bit line memory device of claim 1, wherein said plurality of memory cells comprises an array of memory cells, and wherein a plurality of signal detection units are provided, each signal detection unit comprising a sense amplifier unit, said sense amplifier units being arranged in at least one sense amplifier bank, and each of said sense amplifier units having at least one bit line coupled thereto for sensing a developing signal thereon during said predefined bit line signal development interval.

4. The open bit line memory device of claim 3, wherein said cells of said memory array are arranged in rows and columns, said plurality of bit lines performing column selection of memory cells, and wherein said device further comprises a plurality of periodically spaced word lines for performing row selection of memory cells.

5. The open bit line memory device of claim 4, wherein said memory array is disposed within an array well defined within a supporting substrate.

6. The open bit line memory device of claim 1, wherein said electrical isolating means includes a bit line isolation device disposed between said signal detection unit and said bit line, said bit line isolation device being responsive to a predefined bit line isolation control signal.

7. The open bit line memory device of claim 1, further comprising a predefined reference voltage signal coupled to an input of said signal detection unit, said predefined reference voltage signal being associated with said bit line, and said isolation means including means for isolating said bit line and said reference voltage signal from said signal detection unit during at least a portion of said setting interval.

8. The open bit line memory device of claim 7, further comprising equalization means for selectively equalizing a signal on said bit line with said predefined reference voltage signal.

9. The open bit line memory device of claim 7, wherein said electrical isolation means includes a first switched gate isolation device coupled between said bit line and said signal detection unit, said first switched gate isolation device being controlled by a predefined bit line isolation control signal, and a second switched gate isolation device disposed between a source of said predefined reference voltage signal and said signal detection unit, said second switched gate isolation device being controlled by a predefined reference isolation control signal.

10. The open bit line memory device of claim 1, further comprising at least one data line coupled to said signal detection signal for receiving a set signal therefrom, said set signal comprising one of said two logical states.

11. The open bit line memory device of claim 10, wherein said signal detection unit comprises a sense amplifier unit, said sense amplifier unit including at least one cross-coupled pairing of transistors.

12. A dynamic random access memory device comprising:
   a plurality of memory cells arranged in an open bit line configuration, at least some of said memory cells being interconnected by a bit line, said bit line for performing selection of said interconnected memory cells;
   means for selecting a particular one of said interconnected memory cells for reading;
   a reference voltage line associated with said one bit line, said reference voltage line providing a reference voltage signal,
   a sense amplifier coupled to said one bit line for sensing a developing signal from said selected one of said plurality of interconnected memory cells during a predefined bit line signal development period, said sense amplifier also being coupled to said reference voltage line for receiving said reference voltage signal, said sense amplifier including means for setting to one of two logic states based upon a determined differential between a sensed signal on said bit line and said reference voltage signal during a predefined setting period; and
   means for electrically isolating said bit line and said associated reference voltage line from said sense amplifier for at least a portion of said predefined setting period so that any signal variations on said bit line or said associated reference voltage line are isolated from said sense amplifier.

13. The dynamic random access memory device of claim 12, wherein said electrical isolating means isolates said sense amplifier from said bit line and said reference voltage line for the entire amplifier setting interval.

14. The dynamic random access memory device of claim 12, wherein said plurality of memory cells comprise a memory array, said memory array being disposed within an array well within a supporting substrate.

15. The dynamic random access memory device of claim 12, wherein said sense amplifier comprises a bank of sense amplifier units, and further wherein a plurality of bit lines are provided, each of said bit lines interconnecting at least some of said memory cells, and wherein each of said sense amplifier units couples to a unique one of said plurality of bit lines.

16. The dynamic random access memory device of claim 12, wherein said electrical isolating means includes a bit line isolation transistor disposed between said sense amplifier and said bit line, said bit line isolation transistor being responsive to a predefined bit line isolation control signal, and wherein said isolating means further includes a reference voltage line isolation transistor disposed between said sense amplifier and a source of said reference voltage signal, said reference voltage line isolation transistor being responsive to a pre-defined reference isolation control signal.

17. The dynamic random access memory device of claim 12, further comprising equalization means for equalizing a signal on said bit line with said pre-defined reference voltage signal for a predefined equalization charging interval before said predefined bit line signal development interval.

18. The dynamic random access memory device of claim 12, further comprising at least one data line coupled to said sense amplifier for reading a set signal therefrom, said amplifier set signal comprising one of said two logical states.

19. A memory cell reading method for an open bit line configured memory device having a plurality of memory cells arranged in rows and columns and a signal sensing device associated with said memory cells, said device further including a plurality of periodically spaced bit lines for performing column selection of memory cells and a plurality of periodically spaced word lines for performing row selection of memory cells, said cell reading method comprising the steps of:
   (a) allowing a signal to develop on one of said plurality of bit lines representative of the state of a selected one of a plurality of memory cells interconnected by said bit line;
   (b) using said sensing device to read the signal on said one bit line of step (a) during a predefined bit line signal development period;
   (c) isolating said one bit line from said sensing device; and
   (d) at least partially simultaneous with said step (c), setting said sensing device to one of two logical states based upon said signal developed in said step (a) on said one bit line, said isolating step (c) allowing said sensing device to at least partially set independent of continuing signal variations on said one bit line.

20. The memory cell reading method of claim 19, wherein said step (d) includes setting said sensing device to said one of two logical states simultaneous with said isolating step (c).

21. The memory cell reading method of claim 19, further comprising the step of providing a reference voltage signal to said sensing device, said reference voltage signal being associated with said one bit line, said sensing device setting of step (d) including determining a differential between the signal read on said one bit line and said reference voltage signal.

22. The memory cell reading method of claim 21, wherein said isolating step (c) further includes isolating said reference voltage signal from said sensing device.

23. The memory cell reading method of claim 19, further comprising the step of providing a reference voltage signal, said reference voltage signal being associated with said one bit line, and wherein said memory cell reading method further includes equalizing a signal on said one bit line with said reference voltage signal prior to said bit line signal development of step (a), and wherein said allowing step (a) includes discontinuing said equalizing of the signal on said one bit line and said reference voltage signal.

24. The memory cell reading method of claim 19, further comprising the step of selecting said one memory cell to be read, said memory cell selecting step employing a corresponding one of said plurality of periodically spaced word lines.

25. The memory cell reading method of claim 19, further comprising the steps of discontinuing said isolating of step (c) subsequent said setting of said sensing device, and rewriting said selected one of said plurality of memory cells with a value corresponding to the signal read therefrom.

* * * * *

UNITED STATES PATENT AND TRADEMARK OFFICE
CERTIFICATE OF CORRECTION

PATENT NO. : 5,303,196
DATED : Apr. 12, 1994
INVENTOR(S) : Dhong et al.

Page 1 of 2

It is certified that error appears in the above-indentified patent and that said Letters Patent is hereby corrected as shown below:

On the title page:

Under United States Patent [19]

Delete "Sang et al." and substitute therefor --Dhong et al.--.

Item [75] Inventors: delete "Hoo D. Sang, Mahopac, N.Y.;" and substitute therefor --Sang H. Dhong, Mahopac, N.Y.;--

Column 3, line 57, delete "$Dl_j$" and substitute therefor --"$DL_j$"--.

UNITED STATES PATENT AND TRADEMARK OFFICE
CERTIFICATE OF CORRECTION

PATENT NO. : 5,303,196
DATED : April 12, 1994
INVENTOR(S) : DHONG ET AL

It is certified that error appears in the above-indentified patent and that said Letters Patent is hereby corrected as shown below:

Column 9, line 23 delete "signal" (second occurrence) substitute therefor --unit--.

Signed and Sealed this

Sixteenth Day of August, 1994

Attest:

BRUCE LEHMAN

Attesting Officer       Commissioner of Patents and Trademarks